United States Patent
Lindsay et al.

(10) Patent No.: US 6,673,424 B1
(45) Date of Patent: Jan. 6, 2004

(54) DEVICES BASED ON MOLECULAR ELECTRONICS

(75) Inventors: Stuart Lindsay, Phoenix, AZ (US); John Devens Gust, Mesa, AZ (US); Xiaodong Cui, Tempe, AZ (US)

(73) Assignee: Arizona Board of Regents, Tempe, AR (US)

(*) Notice: Subject to any disclaimer, the term of this patent is extended or adjusted under 35 U.S.C. 154(b) by 0 days.

(21) Appl. No.: 10/173,939

(22) Filed: Jun. 18, 2002

Related U.S. Application Data

(60) Provisional application No. 60/299,262, filed on Jun. 19, 2001.

(51) Int. Cl.[7] .................................................. B32B 7/00
(52) U.S. Cl. ........................ 428/209; 428/457; 428/546; 428/704; 428/910; 427/430.1; 427/435
(58) Field of Search ................................ 428/209, 704, 428/457, 546, 624, 686, 220, 402, 910; 427/430.1, 435, 384, 388.1

(56) References Cited

PUBLICATIONS

Leatherman, et al., "Carotene as a Molecular Wire: Conducting Atomic Force Microscopy," *J. Phys. Chem. B.*, 1999, pp. 4006–4010, vol. 103, No. 20, American Chemical Society. No month.

Mujica, et al., "Electron Conduction in Molecular Wires. I. a Scattering Formalism," *J. Am. Chem. Soc.*, Oct. 10, 1994, pp. 6849–6855, vol. 101, No. 8, American Institute of Physics.

Porath, et al., "Direct Measurement of Electrical Transport Through DNA Molecules," *Nature*, Feb. 10, 2000, pp. 635–638, vol. 403, Macmillan Magazines, Ltd.

Reed,et al., "Computing with Molecules," *Scientific American*, Jun. 2000, pp. 86–93, vol. 282, No. 6.

Reed, et al., "Conductance of a Molecular Junction," *Science*, Oct. 10, 1997, pp. 252–254, vol. 278.

Schlenoff, et al., "Stability and Self–Exchange in Alkanethiol Monolayers," no Month *J. Am. Chem. Soc.*, 1995, pp. 12528–12536, vol. 117, No. 50, American Chemical Society.

Siepmann, et al., "Monte Carlo Simulation of the Mechanical Relaxation of a Self–Assembled Monolayer," *Physical Review Letters*, Jan. 25, 1993, pp. 453–456, vol. 70, No. 4, The American Physical Society.

Son, et al., "Role of Stress on Charge Transfer Through Self–Assembled Alkanethiol Monolayers on Au," *Physical Review Letters*, Jun. 4, 2001, pp. 5357–5360, vol./ 86, No. 23, The American Physical Society.

Voss, "Cheap and Cheerful Circuits," *Nature*, Sep. 28, 2000, pp. 442–444, vol. 407, Macmillan Magazines Ltd.

Weare, et al., "Improved Synthesis of Small ($d^{CORE} \approx 1.5$ nm) Phosphine–stabilized Gold Nanoparticles," *J. Am. Chem. Soc.*, 2000, pp. 12890–12891, vol. 122, No. 51, American Chemical Society. No Month.

Ball, "Chemistry Meets Computing," *Nature*, Jul. 13, 2000, pp. 118–120, vol. 406, Macmillan Magazines, Ltd.

Bumm, et al., "Are Single Molecular Wires Conducting?" *Science*, Mar. 22, 1996, pp. 1705–1707, vol. 271.

(List continued on next page.)

*Primary Examiner*—Deborah Jones
*Assistant Examiner*—Ling Xu
(74) *Attorney, Agent, or Firm*—Christie, Parker & Hale, LLP

(57) ABSTRACT

Molecular electronic devices and method of making molecular electronic devices having a self-assembled ordered insulating molecular electronic film having insulating molecules attached at one end to a first electrode, and conducting device molecules inserted into the insulating molecular electronic film such that the device molecules are attached at the bottom end to a first electrode and the top end to a second electrode are provided.

16 Claims, 9 Drawing Sheets

PUBLICATIONS

Burghard, et al., "Charge Transport in Ultrathin Langmuir–Blodgett Film Devices: Homo–Mediated Tunneling?" *Synthetic Metals*, 1996, pp. 241–244, vol. 76, Elsevier Science. No Month.

Chen, et al., "Large On–Off Ratios and Negative Differential Resistance in a Molecular Electronic Device," *Science*, Nov. 11, 1999, pp. 1550–1552, vol. 286.

Collier, et al., "Electronically Configurable Molecular–Based Logic Gates," *Science*, Jul. 16, 1999, pp. 391–394, vol. 285.

Cygan, et al., "Insertion, Conductivity, and Structure of Conjugated Organic Oligonomers in Self–Assembled Alkanethiol Monolayers on Au{111}," *J. Am. Chem. Soc.*, 1998, pp. 2721–2732, vol. 120, No. 12, American Chemical Society. No Month.

Wold, et al., "Fabrication and Characterization of Metal–Molecule–Metal Junctions by Conducting Probe Atomic Force Microsocopy," *J. Am. Chem. Soc.*, May 18, 2001, pp. 5549–5556, vol. 123, No. 23, American Chemical Society.

Yang, et al., "Conformation and Monolayer Assembly Structure of a Pentiptycene–Derived α, ω–Alkanedithiol," *J. Org. Chem.*, 2000, pp. 871–877, vol. 65, No. 3, American Chemical Society. No Month.

Datta, et al., "Current–Voltage Characteristics of Self–Assembled Monolayers by Scanning Tunneling Microscopy," *Physical Review Letters*, Sep. 29, 1997, pp. 2530–2533, vol. 79, No. 13, The American Physical Society.

Demkov, et al., "Electronic Structure Approach for Complex Silicas," *Physical Review B.*, Jul. 15, 1995, pp. 1618–1630, vol. 52, No. 3, The American Physical Society.

Derose, et al., "Gold Grown Epitaxially on Mica: Conditions for Large Area Flat Faces," *Surface Science.*, pp. 102–108, vol. 256, Elsevier Science Publishers. No Month.

Di Ventra, et al., "First–Principles Calculation of Transport Properties of a Molecular Device," *Physical Review Letters*, Jan. 31, 2000, pp. 979–982, vol. 84, No. 5, The American Physical Society.

Dorogi, et al., Room–Temperature Coulomb Blockade from a Self–Assembled Molecular Nanostructure, *Physical Review B.*, Sep. 15, 1995, pp. 9071–9077, vol. 52, No. 12, The American Physical Society.

Fink, et al., "Electrical Conduction Through DNA Molecules," *Nature*, Apr. 1, 1999, pp. 407–410, vol. 398, Macmillan Magazines Ltd.

Frank, et al., "Carbon Nanotube Quantum Resistors," *Science*, Jun. 12, 1998, pp. 1744–1746, vol. 280.

Gittins, et al., "A Nanometre–Scale Electronic Switch Consisting of a Metal Cluster and Redox–Adressable Groups," *Nature*, Nov. 2, 2000, pp. 67–69, vol. 408, Macmillan Magazines Ltd.

Holmlin, et al., "Electron Transport Through Thin Organic Films in Metal–Insulator–Metal Junctions Based on Self–assembled Monolayers," *J. Am. Chem. Soc.*, 2001, pp. 5075–5085, vol. 123, No. 21, American Chemical Society. No Month.

Ishida, et al., "Insertion Process and Electrical Conduction of Conjugated Molecules in n–Alkanethiol Self–Assembled Monolayers on Au(111)," *Journal of Vacuum Science and Technology*, 2000, pp. 1437–1442, vol. 18, No. 4, American Vacuum Society. No Month.

DEVICES BASED ON MOLECULAR ELECTRONICS

CROSS-REFERENCE TO RELATED APPLICATION(S)

This application claims priority on of U.S. provisional application No. 60/299,262 filed on Jun. 19, 2001, the content of which is incorporated herein by reference.

STATEMENT REGARDING FEDERALLY SPONSORED RESEARCH

The U.S. Government has certain rights in this invention pursuant to grant Nos. DBI-9513233 and CHE-0078835, awarded by the National Science Foundation.

FIELD OF THE INVENTION

The present invention is directed to devices based on molecular electronics, and preferably to devices based on molecular electronics comprising self-assembled, ordered molecular electronic films.

BACKGROUND OF THE INVENTION

There has been a recent surge of interest in molecular electronics (see, e.g., (Ball 2000; Reed and Tour 2000)) and organic electronic materials (reviewed in a Nature news feature: (Voss 2000)). This is driven, in part, by the recent demonstration of potentially useful devices. Examples are a programmable logic element (Collier, Wong et al. 1999) and a molecule with remarkable negative differential resistance (Chen, Reed et al. 1999). Despite this progress, fundamental questions remain unanswered.

For example, one (or a few) benzene dithiol molecules pass(es) a current on the order of a microamp at a bias of 4V (Reed, Zhou et al. 1997) whereas the (almost identical) xylyl dithiol molecule passes less than a nanoamp at a similar bias (Datta, Tian et al. 1997). The three orders of magnitude difference is unlikely to be accounted for by the extra carbons in the xylyl dithiol. Which of these experimental results is correct?

Recent work (Cui, Zarate et al. 2001) shows that the problem lies with the highly variable nature of the electrical contact between the molecule and the contacting metal. Most of the applied electric field might be dropped in the gap between the metal contact and one end of the molecule, so that the current-voltage characteristics are severely distorted. Worse still, the electronic properties of the metal-molecule-metal sandwich may become dependent on one of the poorly controlled metal-to-molecule contacts, leading to unreliable and unpredictable behavior. The same work (Cui, Zarate et al. 2001) showed that these problems were removed if the molecule was chemically bonded at each of its ends to the metal connections. This approach has already been employed in the case of benzenedithiol molecules inserted into a so-called 'break-junction' (Reed, Zhou et al. 1997). In such a device, a molecule, functionalized with a thiol moiety at each end, is assumed to span a small (and otherwise insulating) crack in an electrode. This process relies on accidentally achieving the correct geometry and is extremely hard to control.

Another approach is to make a monolayer of the molecule on an electrode and to contact it by evaporating a metal film onto the top surface (Burghard, Fischer et al. 1996), a process made somewhat more reliable by carrying out the top-metal coating in a micropore (Chen, Reed et al. 1999). Both of these processes rely on physical contact between the molecule and at least one of the metal electrodes.

Yet another approach is to make a pure monolayer of a bifunctionalized molecule and attach a gold particle or electrode to a top thiol moiety while a bottom thiol moiety connects a bottom electrode (Gittins, Bethell et al. 2000). The problem with this approach is that dithiolated molecules may attach to a substrate electrode with both sulfurs, so that each end is tied down and an upper electrode cannot attach covalently to one of the thiol moieties. Even worse, the thiol groups of different molecules can join to form disulfide bridges, so that the molecules join to form polymers of various degrees. Also, it is very difficult to establish that contact is being made to only one molecule.

These experiments have shown that: (i) unambiguous contact to a single molecule is difficult to achieve, (ii) measured currents can be very sensitive to applied stress and (iii) calculated conductivity can disagree with experiment by many orders of magnitud.

Accordingly, a need exists in molecule-based electronics for the formation of reproducible, low resistance electrical contacts between molecules and metal conductors.

SUMMARY OF THE PRESENT INVENTION

The present invention is directed to molecular electronic devices having a self-assembled ordered insulating molecular electronic film having insulating molecules attached at one end to a first electrode, and having conducting device molecules inserted into the insulating molecular electronic film such that the device molecules are chemically attached at the bottom end to a first electrode and the top end to a second electrode.

In one embodiment, the orientation of the molecules in the molecular electronic film is known and controlled.

In another embodiment, the molecular electronic film comprises an ordered alkanethiol self-assembled monolayer composed of alkane chains of approximately the same length as the conducting device molecules that form the molecular electronic device.

In another embodiment of the present invention, the device-forming molecules are inserted into the ordered molecular electronic film by a replacement reaction.

In another embodiment the device-forming molecules are terminated at each end by a thiol moiety. In such an embodiment, one thiol moiety may become attached to the underlying gold substrate during the replacement reaction, while the second thiol moiety is left exposed at the surface of the film after the replacement reaction.

In another embodiment, the surface formed by the molecules is exposed to a fresh solution of nanometer-sized gold particles that eventually attach to the thiols exposed at the surface of the monolayer. In such an embodiment, contact may be made to these chemically attached metal particles, either mechanically or by subsequent evaporation of a top layer.

BRIEF DESCRIPTION OF THE DRAWINGS

These and other features and advantages of the invention will be apparent from the following detailed description, appended claims, and accompanying drawings, in which:

DESCRIPTION OF THE PREFERRED EMBODIMENTS

The present invention is directed to devices based on molecular electronics, and preferably to devices based on molecular electronics comprising self-assembled, ordered molecular electronic films.

The molecular electronic devices according to the current invention comprise a self-assembled highly ordered insulating molecular electronic film having insulating molecules attached at one end to a first electrode, and having conducting device molecules inserted into the insulating molecular electronic film such that the device molecules are attached at the bottom end to a first electrode and the top end to a second electrode.

Figure 6:
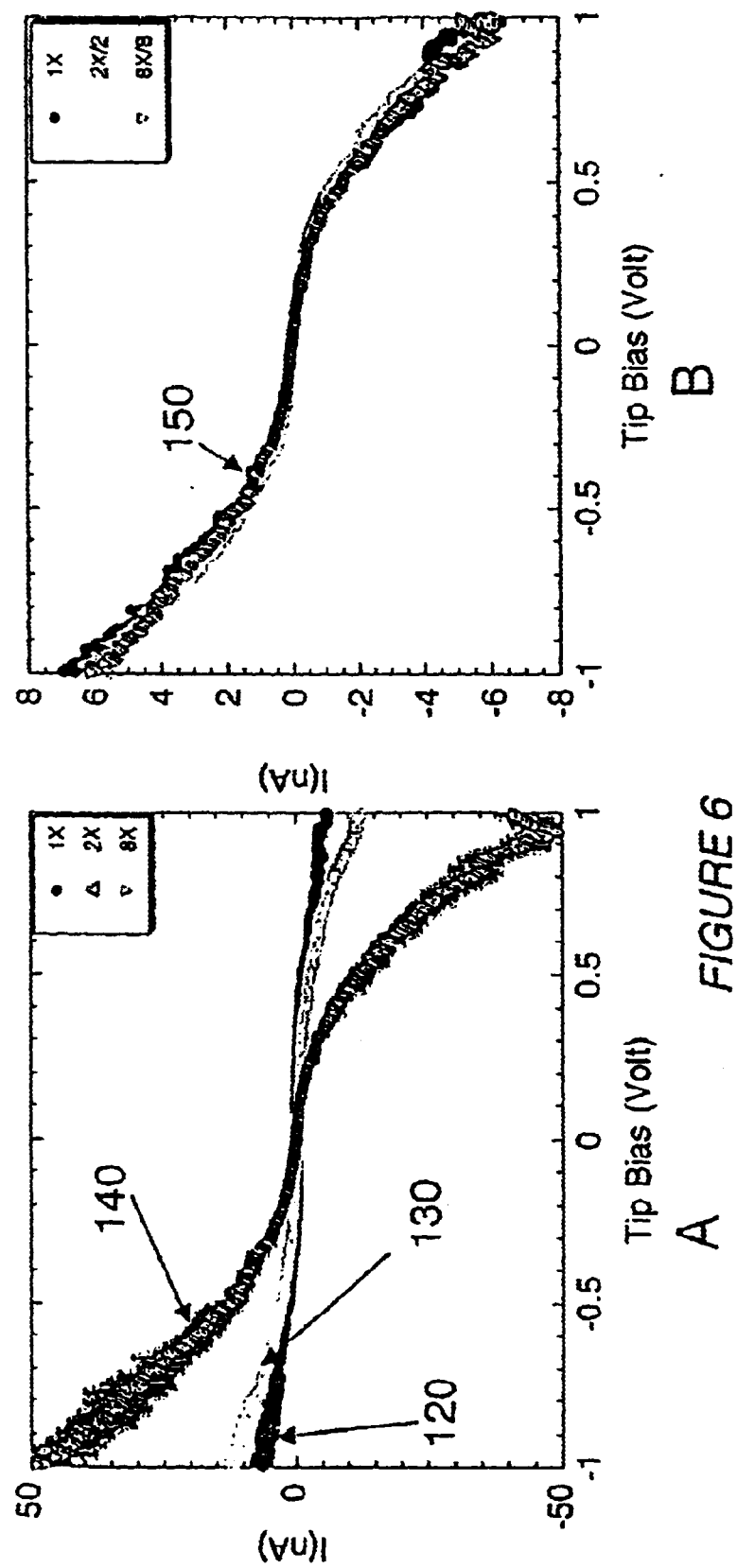
FIG. 6: shows a graphical depiction of the electrical characteristics of sample devices, wherein: (A) shows current vs. voltage data for 1, 2 and 8 molecules contacted; and (B) shows the same curves divided by 1, 2 and 8 showing that they are identical. In this graph the substrate current is plotted versus the top contact bias so current is shown as negative for a positive bias applied.
Figure 8:
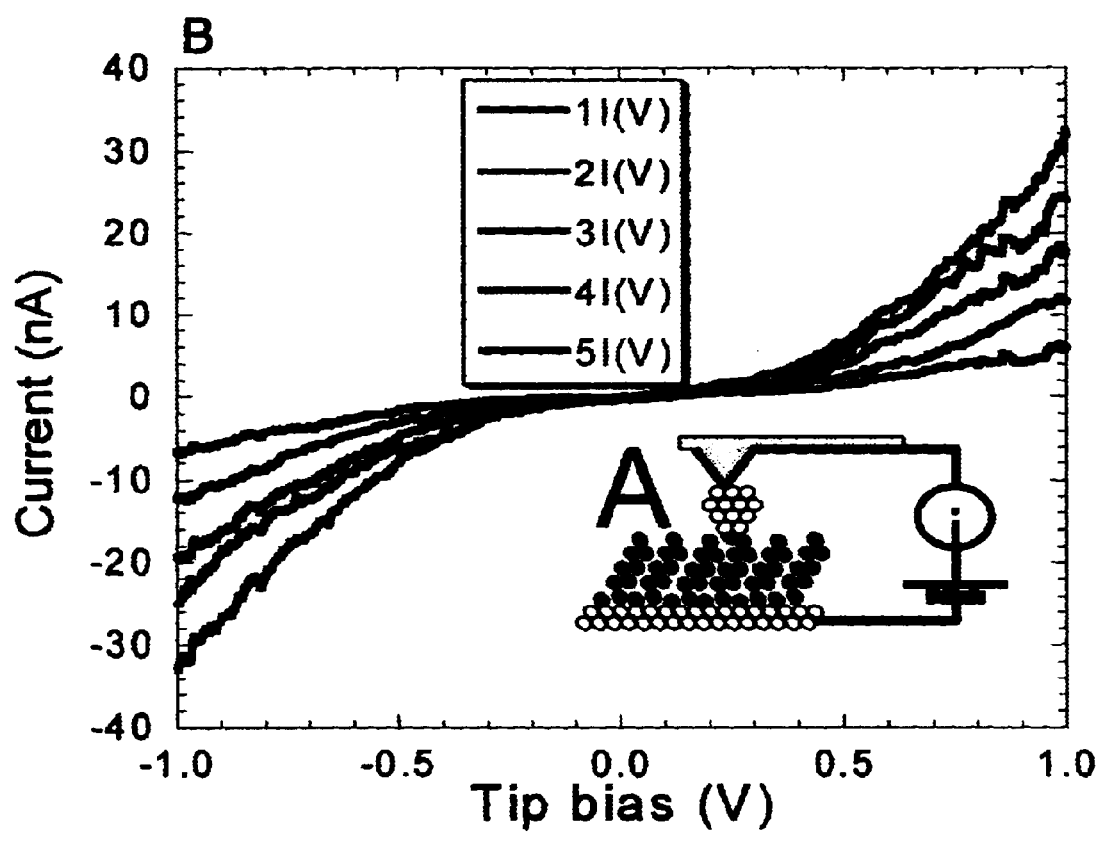
FIG. 8: (A) current voltage (I(V)) curves of gold nanoparticle tipped 1,8-octane dithiol device-molecules inserted in an octanethiol self-assembled monolayer on Au(111) (inset); (B) curves from (A) divided by 1, 2, 3, 4 and 5; and (C) a histogram of values of a divisor, X (a continuous parameter), chosen to minimize the variance between any one curve and the fundamental curve, I(V).
Figure 8:
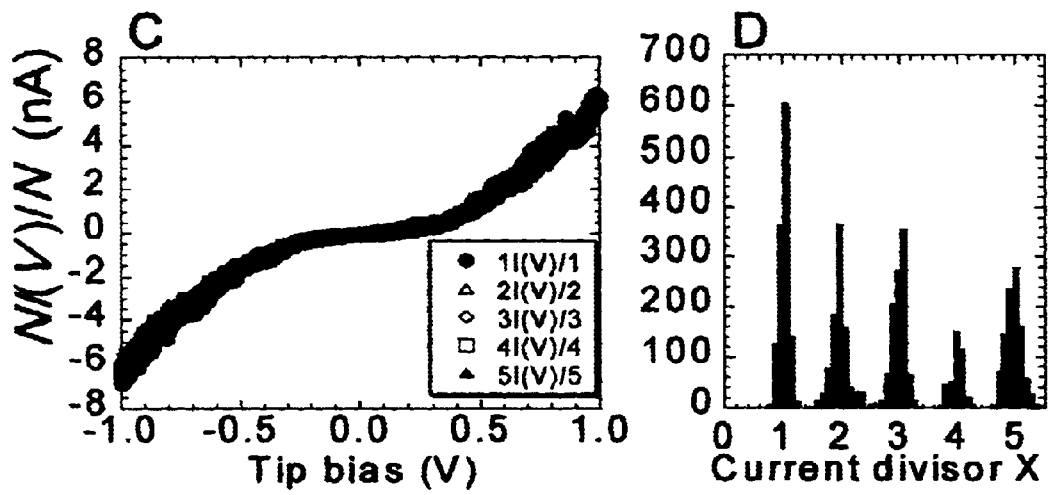
Figure 9:
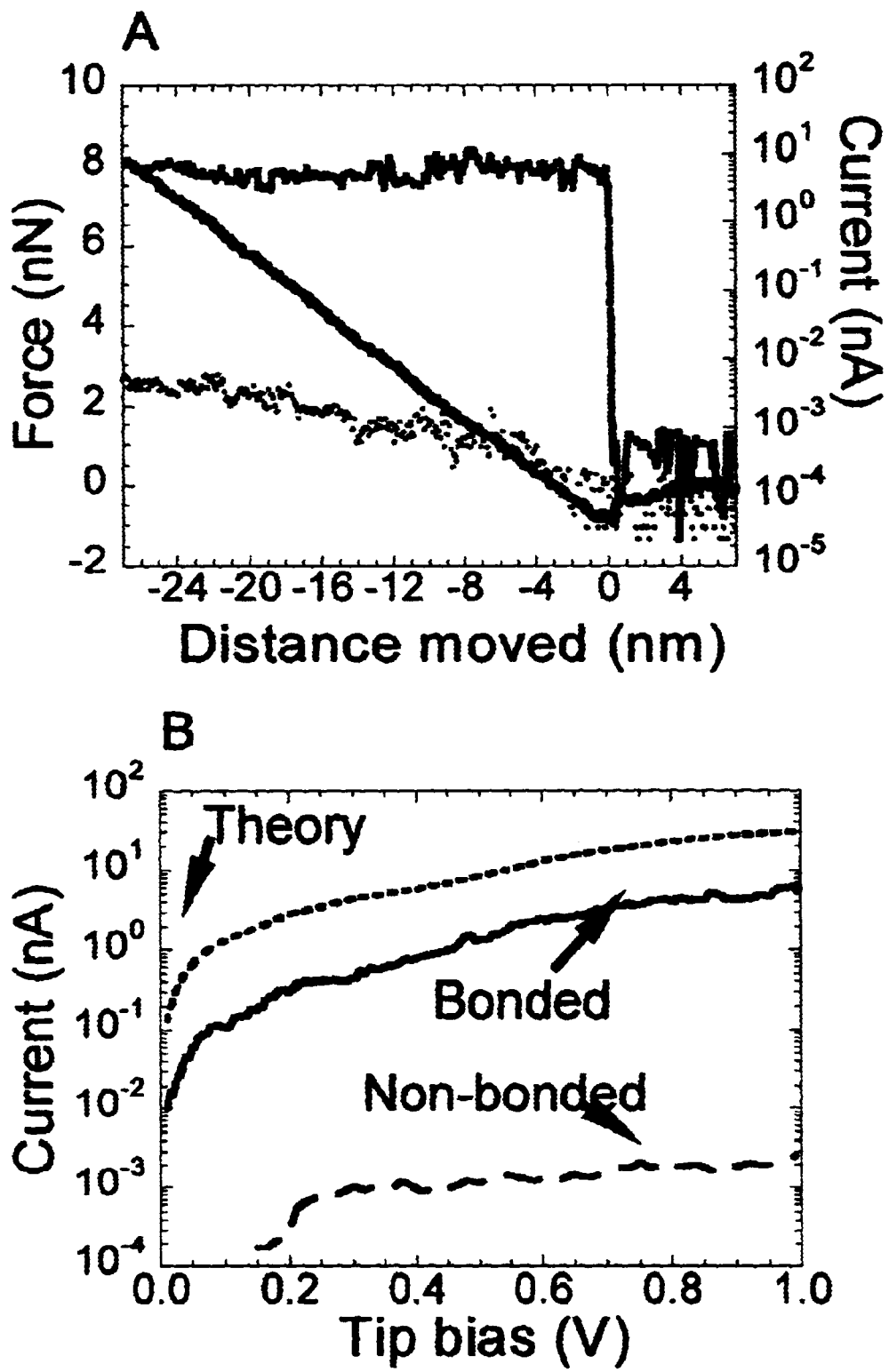
FIG. 9: (A) Current (right axis, log scale) and force (left axis) measured as a conducting atomic force microscope cantilever (biased at +1V) is moved into contact with a gold nanoparticle (solid line) or the surrounding alkanethiol matrix (dashed line); and (B) Current (log scale) as a function of voltage as calculated from first-principles with no adjustable parameters (dashed-line), as measured for a bonded single molecule (black line), and for a non bonded contact (dotted line).

As shown in FIGS. 1 to 4, the molecular electronic device according to the present invention comprises individual conducting device molecules 40, which are bonded at one end to a flat gold surface 20 and isolated from one another by molecules in a monolayer film 10 of molecular insulators. A conducting nanoparticle 50 is bound to the other end of the conducting species and individually contacted by a second conducting electrode. The resulting devices have remarkable properties (FIGS. 6, 8 and 9). Current-voltage curves are: (1) quantized as integer multiples of one fundamental curve, indicating current flow through individual molecules, (2) independent of the stress applied to the contact, and (3) in reasonable accord with a first-principles quantum mechanical simulation with no adjustable parameters.

This invention is also directed to a method of forming such devices. Referring again to FIGS. 1, 2, 3 and 4, the insulating monolayer is first formed on a conducting electrode substrate by methods well known in the art. Substantial increases in flatness, uniformity and cleanliness are achieved if the metal of the conducting electrode is deposited epitaxially by the method described by DeRose et al. (DeRose, Thundat et al. 1991). The deposition is further enhanced by exposing the surface to a hydrogen/air flame for a few (typically one to 60) seconds immediately before placing the conducting metal substrate 20 in a solution of the conducting molecules 10. Left in contact for a period of several (3 to 20) hours, a well-ordered self-assembled monolayer will form 30.

Although any conducting electrode material and any insulating molecular monolayer may be utilized, in a preferred embodiment of the present invention, the conducting electrode is made of gold, such as a Au(111) crystal, the insulating molecular monolayer is made of alkanethiol molecules, and the alkanethiol molecules are chosen to be of approximately the same length as the device-forming molecule.

For example, a switch may be constructed using a molecule of negative differential resistance as described by Chen et al. (Chen, Reed et al. 1999). For the particular molecule described by Chen et al., alkanethiol embedding films made from $CH_3(CH_2)_nSH$ where n=8 through 14 would function well. In the case of the molecular wire described by Leatherman et al. (Leatherman, Durantini et al. 1999), values of n from 20 to 24 would be appropriate.

The device-forming molecule differs from the examples given above in that it is functionalized to contain a reactive moiety, such as a thiol group, at each end, by means well known in the art. Thus, the molecular wire described by Leatherman et al. (Leatherman, Durantini et al. 1999) would be modified by the addition of a terminal SH group at the end of the molecule opposite the thiolated end of the molecule in its original form.

Figure 1:
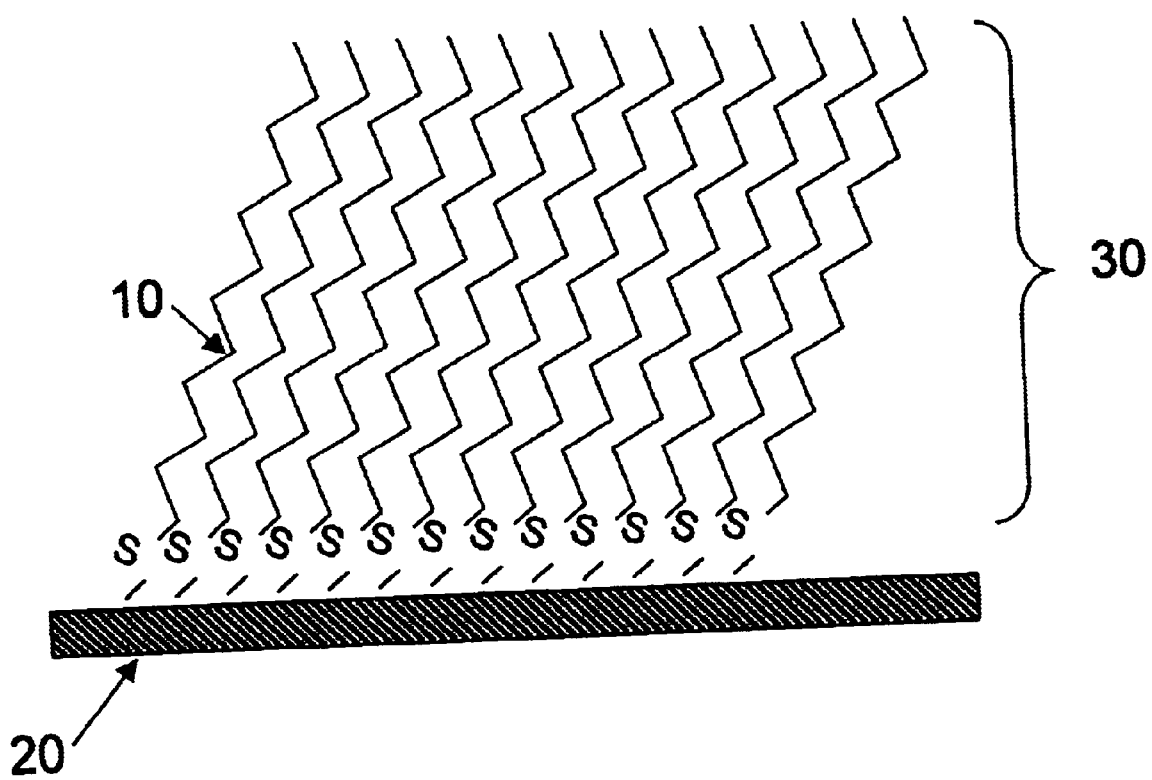
FIG. 1: shows a schematic of a self assembled monolayer of an alkanethiol on a gold substrate. In this exemplary embodiment the molecule used to form the film is $CH_3(CH_2)_{11}SH$.
Figure 2:
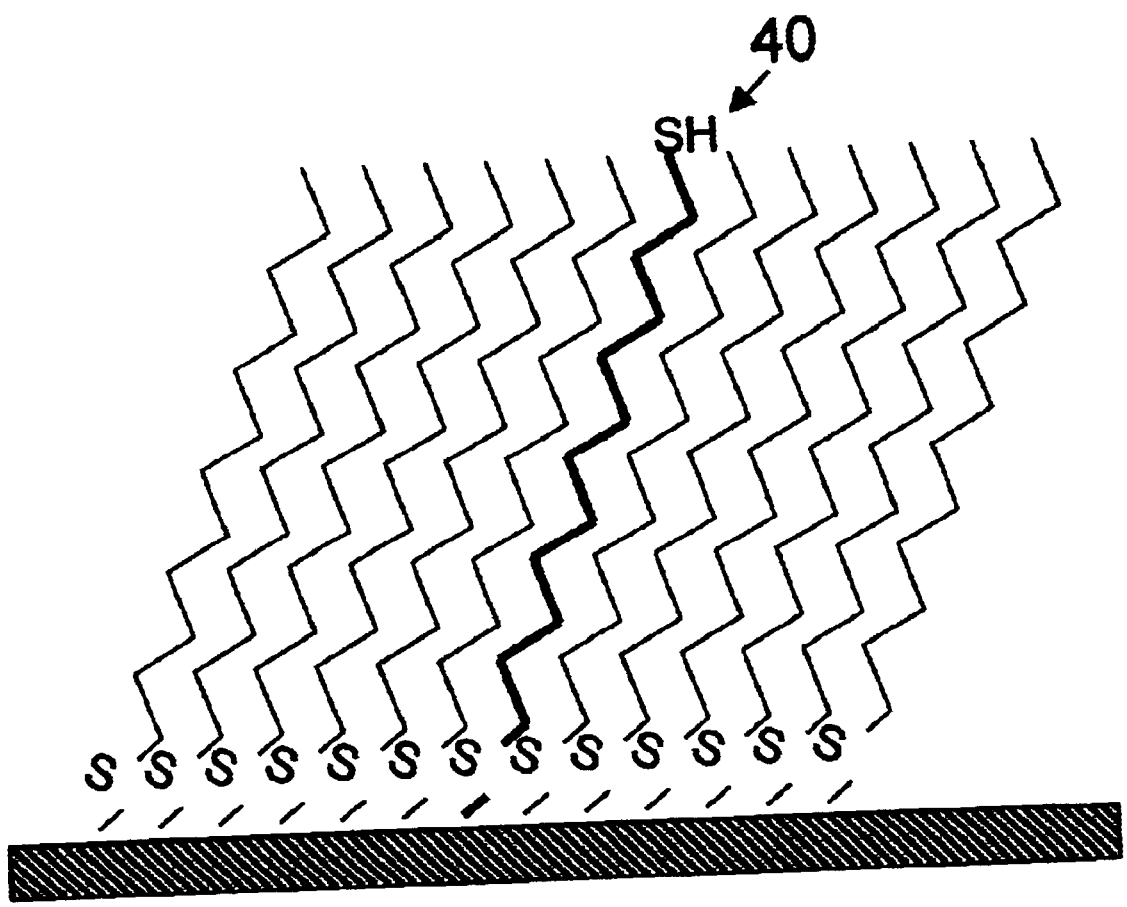
FIG. 2: shows a schematic of the monolayer of FIG. 1 after a device-forming, dithiolated molecule has been inserted by replacement. The device-forming molecule of this exemplary embodiment is an alkanedithiol molecule, which is illustrated schematically by the bold drawing.

Accordingly, in an embodiment utilizing alkanethiol molecules, as shown in FIG. 2, the dithiolated, device-forming molecule is inserted into the alkanethiol monolayer by incubating the monolayer in a solution of the device forming molecule, as described by Bumm et al. (Bumm, Arnold et al. 1996), Ishida et al. (Ishida, Mizutani et al. 2000) and Cygan et al. (Cygan, Dunbar et al. 1998). Typical conditions for this insertion process would be to (1) wash the monolayer as shown in FIG. 1 with a clean solvent such as toluene, ethanol or chloroform, (2) expose the film to a solution of the device-forming molecules. Typical conditions would be a 1 to 10 mM solution of the device-forming molecules in chloroform, ethanol or toluene, exposed for 3 to 24 hours. The device-forming molecules 40 are found to insert into the alkanethiol monolayer 30 as shown in FIG. 2. This is further illustrated in FIG. 5A, which is an STM image of the device shown schematically in FIG. 2.

Figure 5:
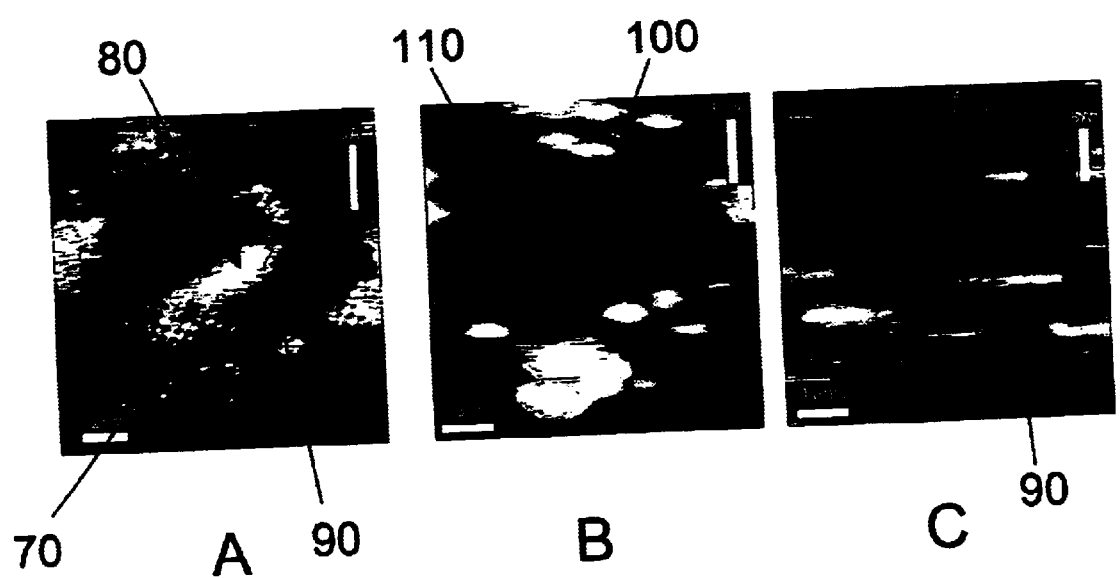
FIG. 5: shows scanning tunneling microscope images of: (A) dithiolated molecules embedded in an alkanethiol monolayer; (B) Gold particles attached to the tops of the dithiolated molecules; and (C) a control alkanethiol monolayer in which gold particles have not attached.

As shown in FIG. 5A, the ordered alkanethiol embedding matrix 70 contains depressions 90 of depth equal to a single layer of gold atoms, these depressions being internally coated with a well-ordered alkanethiol monolayer, though this is not evident in the image. The dithiolated molecules tend to insert into the alkanethiol monolayer near these depressions 90, giving rise to the bright feature in the STM image 80. In FIG. 2, the device-forming molecule is shown as a bold alkanedithiol molecule, but it should be recognized that any molecule of the appropriate length and functionalized in the appropriate way could be inserted in this way.

The assembly as shown in FIG. 2 is unsuitable for attaching a top contact to the device-forming molecule. This is because, on the scale shown in the figure, metallic contacts, whether formed by evaporation of a top layer or by mechanical placement of a small contact, are very rough and unlikely to place facets of gold microcrystals in precisely the correct orientation and position to achieve chemical bonding. Moreover, it has been shown that correct placement of such a top contact is critical for reproducible electrical contact to be made to molecules. (Cui, Zarate et al. 2001.)

Figure 3:
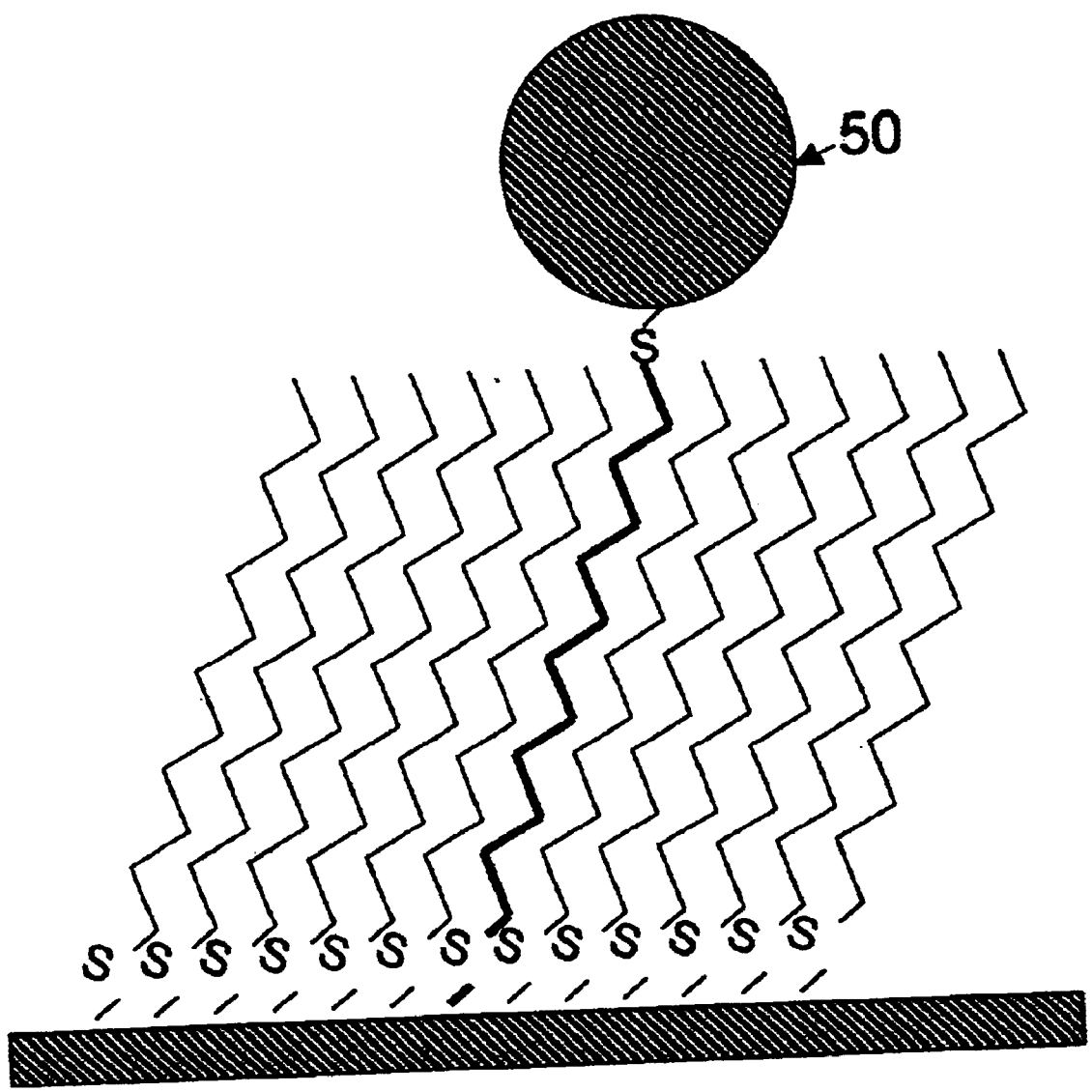
FIG. 3: shows a schematic of the device-forming molecule in the alkanethiol monolayer after attachment of a gold particle.

As such it is necessary to provide an intermediate stage of contact for the device-molecule through a conducting particle, as shown in FIG. 3. In such a process, the device-molecule containing film of FIG. 2 is exposed to a suspension of conducting particles and these are allowed to find target binding sites on the top side of the film by a conventional process, such as, for example, free-diffusion in solution, where the particles are unconstrained, in contrast to low-temperature-evaporated or physically-placed particles which would be constrained from sampling areas containing binding sites. One method for making such conducting particles of gold is described by Weare et al., and is incorporated herein by reference. (Weare, Reed et al. 2000.).

Although it is not essential that the conducting particles be of a particular dimension, or be made of gold, as are those described by Weare et al., it is important that the conducting suspension be capable of reasonably free movement so that the conducting particles in the solution or suspension are able to find the target reactive groups on the top of the film.

In one embodiment, for example, gold particles of about 1.5 nm diameter (for the metal core) are formed from a reaction of hydrogentetrachloroaurate with triphenylphosphine. The resulting particles are stabilized with a surface layer of triphenylphosphine. This layer limits aggregation of the particles but it is easily displaced by thiols. In the preferred embodiment of the current invention, a fresh (prepared within two days) suspension of these particles is made to a concentration of about 0.25 gm per liter in methylene chloride. The alkanethiol monolayer 30 with device forming molecules inserted 40 as shown in FIG. 2 is then exposed to this solution for a time ranging from one to twenty hours.

After this time, the film is rinsed copiously with clean methylene chloride and gold particles 50 are found to be strongly attached to the exposed thiols on top of the film as shown in FIG. 3. An image of a practical realization of this device is shown in FIG. 5B. As shown, the gold particles 100 are strongly attached to regions of the film where dithiolated device-forming molecules were inserted. Other areas 110, not containing device-forming molecules are flat and highly ordered. Alkanethiol monolayers not containing device forming molecules and exposed to gold particles in just the same manner do not have any gold spheres attached after rinsing, as shown for comparison in FIG. 5C. The only features observed in FIG. 5C are the depressions 90 previously referred to.

Figure 4:
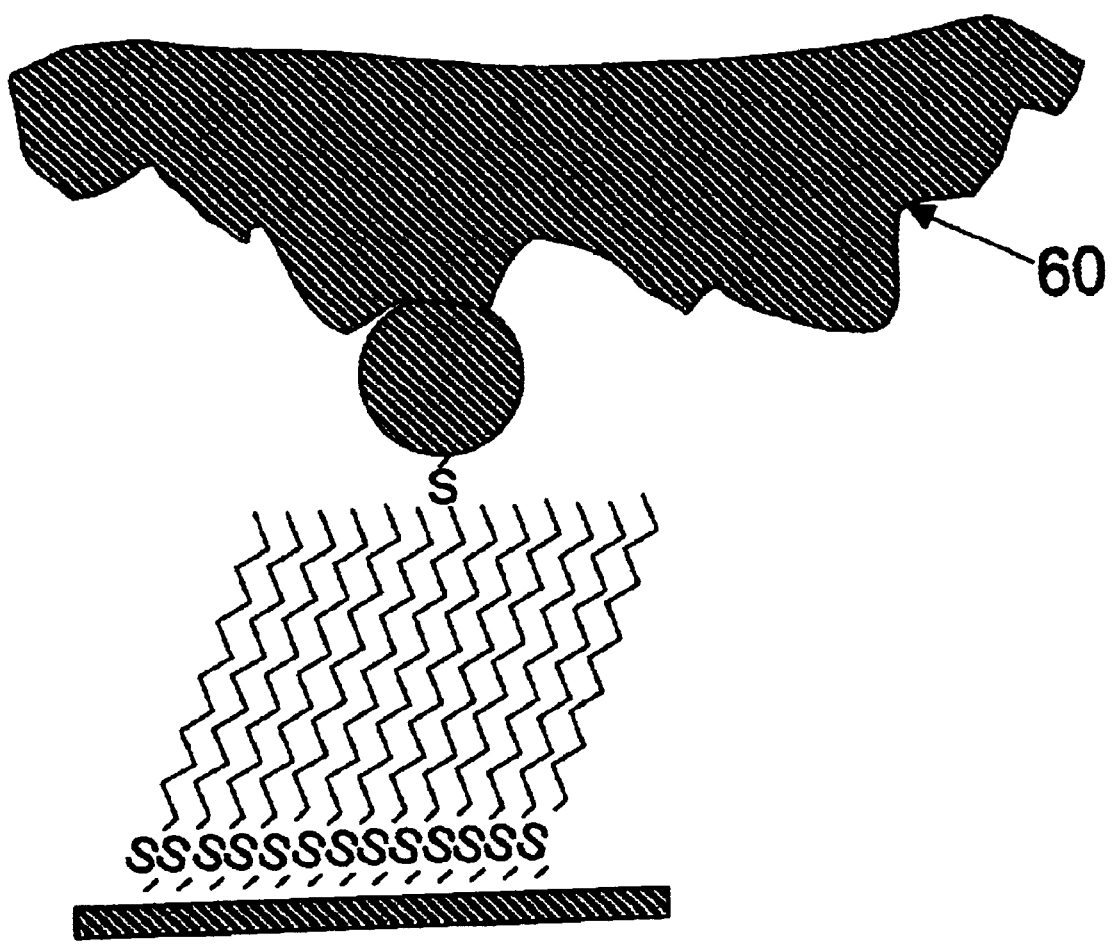
FIG. 4: shows a schematic of the overall arrangement whereby a top electrode contacts the gold particles and a bottom electrode contacts the lower part of the device-forming molecule.

In the final stage of the assembly of the device according to the current invention, a top electrode 60 is applied so as to contact the attached conducting particles 50 as shown in FIG. 4. One way to do this is to evaporate a top electrode layer of a conducting metal, such as gold. Another way is to simply press a top contact against the top of the monlayer. The physical characteristics of an electronic device made according to the current invention are shown in FIGS. 6A and 6B. In this case, the second contact is a gold-coated atomic force microscope probe of end-radius of about 10 nm. Such a probe contacting a gold particle may be pushed into the film with a contact force as small as a small fraction of 1 nN or as large as at least 15 nN with no alteration of the electrical characteristics.

FIG. 6A shows a sample of the electrical characteristics measured at three points on the film. Each current-voltage curve is the mean of between three and twelve separate measurements. The data are shown as points with error bars corresponding to the standard deviation of the set of measurements. In this case, the alkanethiol monolayer was made from $CH_3(CH_2)_7SH$ and the device-forming molecule was $SH(CH_2)_8SH$. The three curves 120, 130, 140 appear to be rather different. However, when divided by appropriate integers (in this case, 1, 2 and 8) the curves all fall on a common current-voltage curve 150 shown in FIG. 6B. A universal smallest unit of current at a given voltage is always found in devices fabricated this way, and this indicates that a single molecule (or possibly pair of molecules) is being contacted in many cases. It also indicates that the device-forming molecules are contained and contacted in a highly reproducible manner. The largest number observed with the probe just described has been 10 molecular units.

An exemplary embodiment of the invention described above was prepared utilizing octanethiol (Aldrich) monolayers and 1,8-octanedithiol (Aldrich) monolayers.

In this work, 1,8-octanedithiol molecules were inserted into an octanethiol monolayer (on Au(111)) using a replacement reaction, whereby one of the two thiol groups becomes bound to the gold substrate. The octanethiol monolayer acts as a molecular insulator, isolating the dithiol molecules from one another. The thiol groups at the top of the film were derivatized by incubating the monolayer with a suspension of gold nanoparticles.

First, the monolayers were formed from 1 mM solutions of the octanedithiol molecules in toluene left in contact with a flame-annealed Au(111) crystal overnight. Mixed monolayers were formed from octanethiol monolayers on Au(111) incubated in a 1 mM solution of 1,8-octanedithiol in toluene overnight.

Figure 7:
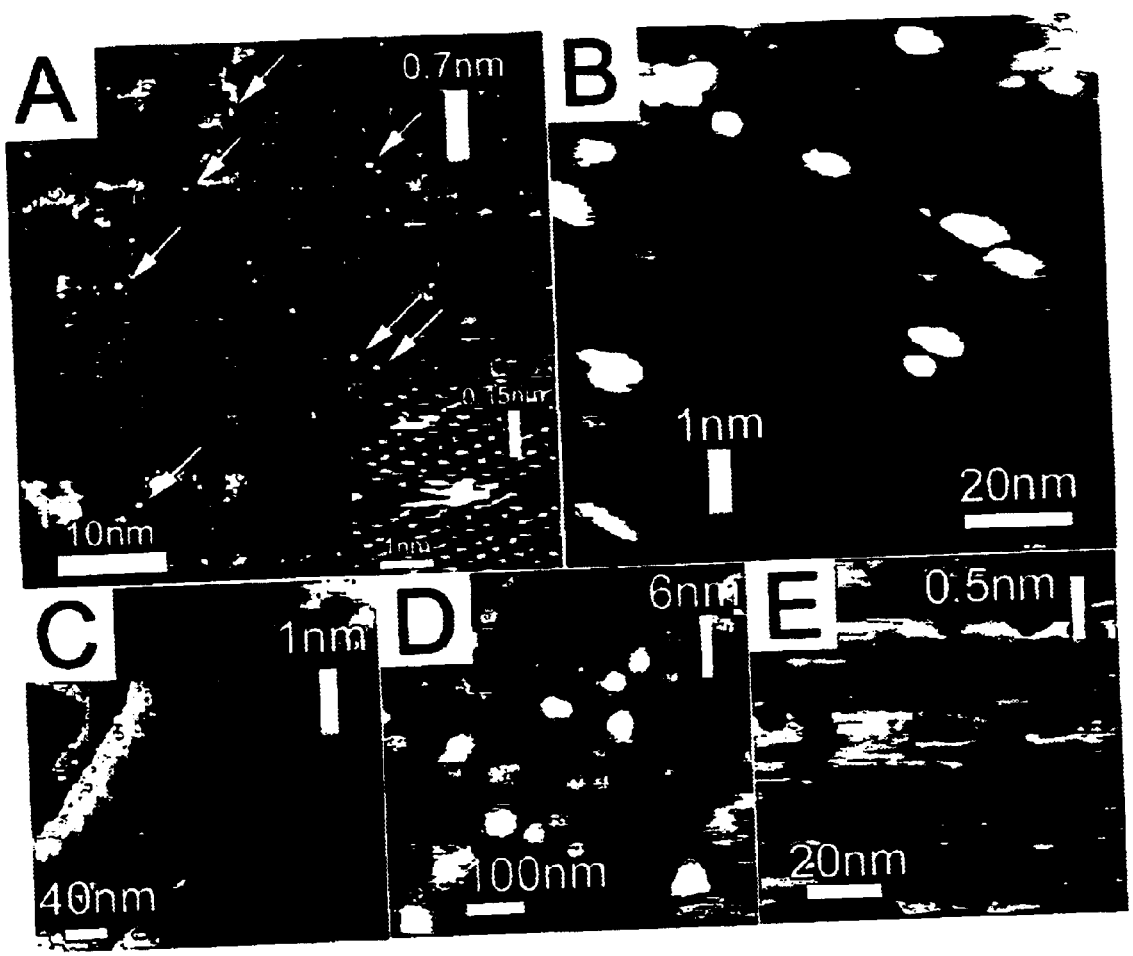
FIG. 7: Scanning tunneling microscope images of: (A) 1,8-octanedithiol molecules inserted into an octanethiol monolayer; (B) a mixed monolayer similar to that shown in (A) after incubation with gold nanoparticles that attached to the protruding thiols; (C) 1,8-octanedithiol monolayer; (D) the same 1,8-octanedithiol monolayer after incubation with the gold nanoparticle suspension and rinsing; and (E) a pure octanethiol monolayer after incubation with the gold nanoparticle suspension and rinsing.

The mixed monolayers were rinsed and imaged under toluene (using STM) showing the inserted dithiol molecules as bright spots (FIG. 7A). Freshly prepared gold nanoparticles of core diameter less than 2 nm were then suspended to a concentration of 0.25 g/L in methylene chloride and incubated with the mixed monolayers overnight. The resulting films were rinsed in methylene chloride, then toluene, and subsequently imaged in toluene. Isolated conducting particles of gold attached to the monolayer were observed (FIG. 7B). Control experiments showed that a pure 1,8-octanedithiol monolayer (FIG. 7C) became covered by large gold aggregates when treated with the nanoparticle suspension (FIG. 7D) whereas the pure alkanethiol monolayer was unaffected (FIG. 7E). All STM images were obtained with electrochemically-etched PtIr tips using a PicoSPM (Molecular Imaging) with the liquid cell operated in a nitrogen environment.

Conducting AFM data were acquired with the PicoSPM using silicon cantilevers (spring constant 0.35 N/m) sputtercoated with 5 nm of chrome followed by 50 nm of Au. The films were imaged and contacted in the same conditions used for STM.

Theoretical current-voltage curves were calculated using scattering theory with Green's function elements obtained from Fireballs-96. The charge distribution was calculated self-consistently, eliminating the need for adjustable parameters (such as the relative position of the Fermi level). The molecular structure was first optimized using Hellmann-Feynman forces with the molecule embedded in an infinite alkanedithiol matrix between two gold slabs. The terminal H was removed from each thiol group and the sulfur atoms were found to bind to the gold about 0.194 nm above the surface and equidistant from three Au surface atoms. The current was calculated for this geometric structure by contacting a single molecule between a pair of Au(111) clusters of 4×4 by 5 atoms deep (avoiding technical problems for current calculations in an infinite system). A similar process was used for the non-bonded structure.

For the experimental current measurements, a gold-coated conducting atomic force microscope probe was used to locate and contact individual particles bonded to the monolayer, as illustrated in the inset in FIG. 8A. Current-voltage curves measured in this way were remarkably reproducible and independent of contact force. Measurements made on different nanoparticles produced distinct sets of curves, examples of which are shown in FIG. 8A. The curves correspond to multiples of a fundamental curve, and lie on this fundamental curve when divided by the appropriate integer, as shown in FIG. 8B. To test for this property in all of the curves we measured, we found values of a continuous divisor, X, that minimized the variance between the fundamental data set and all others. A histogram of 5,400 values of X (FIG. 8C) shows that it is sharply peaked at the integer values 1,2,3,4 and 5 (with a small number of higher values not shown). Over 1000 curves correspond to single molecule contacts.

A key factor permitting identification of these fundamental curves is the striking lack of dependence on contact force for these chemically-bonded contacts, as shown in FIG. 9A (solid line). In contrast, non-bonded contacts made by moving the tip onto the alkanethiol monolayer (dashed line) show a strong force-dependence. The stress on the monolayer is probably somewhat higher when contact is made through gold nanoparticles rather than by direct contact with the AFM because the particles are smaller than the end radius of the AFM probe (measured to be about 10 nm by SEM). Thus, the monolayer must undergo significant deformation in both cases. The lack of force-dependence of the chemically-bonded contact implies that (a) interatomic distances within a molecule do not change much as the film is stressed, consistent with simulations of deformation in alkanethiol monolayers and that (b) the bonds between the molecule and the metal do not change significantly either.

A theoretical current-voltage curve was calculated using the parameter-free method described above. The results of this calculation are shown on a log scale as the dashed-line in FIG. 9B. A measured single-molecule current-voltage curve for the bonded contact is shown as the black line. The shapes of the calculated and measured curves are in agreement and the absolute values of current agree to within a factor of six. In contrast, current measured with a non-bonded contact (dotted-line) is much smaller and has a different voltage dependence. Simulations were also carried out for a non-bonded monothiol with the terminal methyl group positioned near a gold surface. The results were similar to the dithiol simulation (dashed-line) but depend strongly on the exact placement of the methyl group with respect to the gold. This placement is difficult to determine theoretically in the absence of bond-formation. Clearly the experimentally observed device resistance is dominated by the contact in the case of a non-bonded contact. In the Ohmic region (between ±0.1V) the current through the non-bonded contact is difficult to measure experimentally because of noise, but the total resistance is probably more than $10^4$ GΩ (at a contact stress of about 1 GPa). In the same voltage range, the bonded single molecule has a resistance of 900(±50)MΩ.

Accordingly, utilizing the current invention for creating self-assembled metal contacts to molecules embedded in an insulating matrix permits reliable and reproducible electrical connection to single molecules, overcoming the difficulties associated with earlier methods. This approach is straightforward and easily applied to other types of molecules, setting the stage for the mass-production of an infinite variety of reliable molecular electronics devices.

Although only molecular electronic connections based on thiolated alkanes on gold conducting surfaces are described above, it should be understood that any conducting metal may be utilized as the top and bottom electrodes of the current invention. In addition, any molecule or mixture of molecules capable of forming an ordered, insulating monolayer on one of the two electrodes may be utilized to make the molecular electronic film and the device-molecules. Finally, any reactive group capable of bonding the molecules to the chosen conducting metal may be utilized.

Although specific embodiments are disclosed herein, it is expected that persons skilled in the art can and will design alternative molecule-based electronic devices, and methods to produce such molecule-based electronic devices that are within the scope of the following claims either literally or under the Doctrine of Equivalents.

What is claimed is:

1. A molecular electronic device, consisting of
   a bottom electrode;
   an insulating molecular monolayer disposed on said bottom electrode;
   at least one device-forming molecule with a reactive group at a first end and a reactive group at a second end, the reactive group on the second end being inserted into said insulating molecular monolayer;
   metal particles reacted with said reactive group on the first end of said device-forming molecule; and
   a top metal electrode contacted with said metal particles.

2. The device of claim 1 in which said insulating molecular monolayer is made of alkanethiol molecules.

3. The device of claim 2 in which said alkanethiol molecules are chosen to be of similar length to said device-forming molecule.

4. The device of claim 1 in which said bottom electrode is gold.

5. The device of claim 1 in which said reactive groups at each end of said device-forming molecule are thiols.

6. The device of claim 1 in which said metal particles are phosphine-stabilized gold particles.

7. The device of claim 1 in which said top metal electrode is evaporated gold.

8. The device of claim 1 in which said top metal electrode is a gold probe.

9. A method of fabricating a molecular electronic device in which
   forming a bottom electrode;
   forming an insulating molecular monolayer on said bottom electrode;

providing at least one device-forming molecule having a reactive group on a first end and a reactive group on a second end;

inserting the second end of the at least one device-forming molecule into said insulating molecular monolayer;

reacting metal particles with said reactive group on the first end of said device-forming molecule; and contacting a top electrode to said metal particles.

10. The method of claim 9 in which said insulating molecular monolayer is made of alkanethiol molecules.

11. The method of claim 10 in which said alkanethiol molecules are chosen to be of similar length to said device-forming molecule.

12. The method of claim 9 in which said bottom electrode is gold.

13. The method of claim 9 in which said reactive groups at each end of said device-forming molecule are thiols.

14. The method of claim 9 in which said metal particles are phosphine-stabilized gold particles.

15. The method of claim 9 in which said top metal electrode is evaporated gold.

16. The method of claim 9 in which said top metal electrode is a gold probe.

* * * * *